US012745348B2

(12) United States Patent
Sano et al.

(10) Patent No.: US 12,745,348 B2
(45) Date of Patent: Sep. 22, 2026

(54) WIRING BOARD

(71) Applicant: KYOCERA Corporation, Kyoto (JP)

(72) Inventors: Hiroaki Sano, Kagoshima (JP); Toshifumi Higashi, Kirishima (JP); Akira Imoto, Kirishima (JP); Takafumi Yamaguchi, Kirishima (JP); Sentarou Yamamoto, Kagoshima (JP)

(73) Assignee: KYOCERA CORPORATION, Kyoto (JP)

( * ) Notice: Subject to any disclaimer, the term of this patent is extended or adjusted under 35 U.S.C. 154(b) by 167 days.

(21) Appl. No.: 18/851,565

(22) PCT Filed: Mar. 13, 2023

(86) PCT No.: PCT/JP2023/009735
§ 371 (c)(1),
(2) Date: Sep. 26, 2024

(87) PCT Pub. No.: WO2023/189513
PCT Pub. Date: Oct. 5, 2023

(65) Prior Publication Data

US 2025/0185162 A1 Jun. 5, 2025

(30) Foreign Application Priority Data

Mar. 30, 2022 (JP) ................................ 2022-056142

(51) Int. Cl.
*H05K 1/03* (2006.01)

(52) U.S. Cl.
CPC ... *H05K 1/0306* (2013.01); *H05K 2201/0175* (2013.01); *H05K 2201/0209* (2013.01); *H05K 2201/0257* (2013.01)

(58) Field of Classification Search
CPC .................................................... H05K 1/0306
USPC .......................................................... 174/258
See application file for complete search history.

(56) References Cited

U.S. PATENT DOCUMENTS

2004/0013860 A1* 1/2004 Sumi ...................... H05K 1/092 428/209
2012/0276401 A1* 11/2012 Nakayama ............. H05K 3/246 428/596
2016/0338201 A1 11/2016 Kiyono et al.

FOREIGN PATENT DOCUMENTS

JP 2003-123537 A 4/2003
JP 2003-277852 A 10/2003
JP 2004-134378 A 4/2004
JP 2008159726 * 12/2006
JP 2008-159726 A 7/2008
WO WO-2015118982 A1 * 8/2015 ............ H10W 72/20

* cited by examiner

*Primary Examiner* — Stanley Tso
(74) *Attorney, Agent, or Firm* — Volpe Koenig

(57) ABSTRACT

A wiring board includes an insulation layer made of a ceramic, and an electrical conductor layer extending in a planar direction inside the insulation layer. The electrical conductor layer is constituted by a sintered body of a plurality of crystallites containing a metal as a main component. When a specific range of the electrical conductor layer is specified in a cross-sectional view, a linear length in the planar direction is defined as L0, and a length of a contour of the electrical conductor layer is defined as L1, L1/L0 is within a range from 1.04 to 1.40.

4 Claims, 2 Drawing Sheets

WIRING BOARD

TECHNICAL FIELD

Embodiments of the present disclosure relate to a wiring board.

BACKGROUND OF INVENTION

A known wiring board includes an insulation layer containing a ceramic as a main component and an electrical conductor layer containing a metal as a main component. Such a wiring board is obtained by, for example, simultaneously firing an electrical conductor material, obtained by adding a metal oxide to copper powder, and a glass ceramic as an insulation layer material (refer to Patent Document 1, for example).

CITATION LIST

Patent Literature

Patent Document 1: JP 2003-277852 A

SUMMARY

A wiring board of the present disclosure includes an insulation layer made of a ceramic and an electrical conductor layer extending in a planar direction inside the insulation layer. The electrical conductor layer is constituted by a sintered body of a plurality of crystallites containing a metal as a main component. When a specific range of the electrical conductor layer is specified in a cross-sectional view, a linear length in the planar direction is defined as L0, and a length of a contour of the electrical conductor layer is defined as L1, L1/L0 is within a range from 1.04 to 1.40.

DESCRIPTION OF EMBODIMENTS

Hereinafter, embodiments of a wiring board disclosed in the present application will be described with reference to the accompanying drawings. The present disclosure is not limited by the following embodiments. The embodiments can be appropriately combined within a range so as not to contradict each other in terms of processing content. In the following embodiments, the same portions are denoted by the same reference signs, and redundant explanations are omitted.

In the following embodiments, expressions such as "parallel" may be used, but these expressions do not necessarily mean exactly "parallel". That is, the expressions described above allow for deviations in, for example, manufacturing accuracy, installation accuracy, and the like.

A known wiring board includes an insulation layer containing a ceramic as a main component and an electrical conductor layer containing a metal as a main component. Such a wiring board is obtained by, for example, simultaneously firing an electrical conductor material, obtained by adding a metal oxide to copper powder, and a glass ceramic as an insulation layer material.

However, in the known art, there is room for further improvement in increasing an interface electrical conductivity of the electrical conductor layer. As such, a technique that can overcome the aforementioned problem and increase an interface electrical conductivity of an electrical conductor layer in a wiring board is expected to be achieved.

Figure 1:
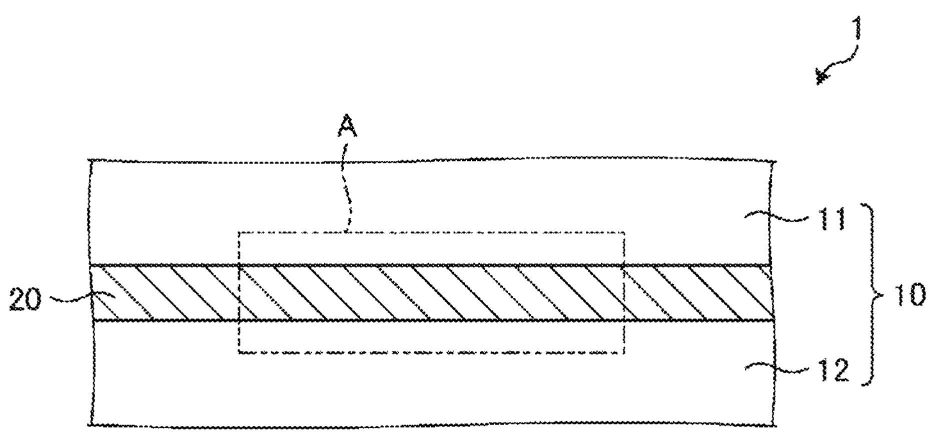
FIG. 1 is an enlarged cross-sectional view illustrating an example of a configuration of a wiring board according to an embodiment.
Figure 2:
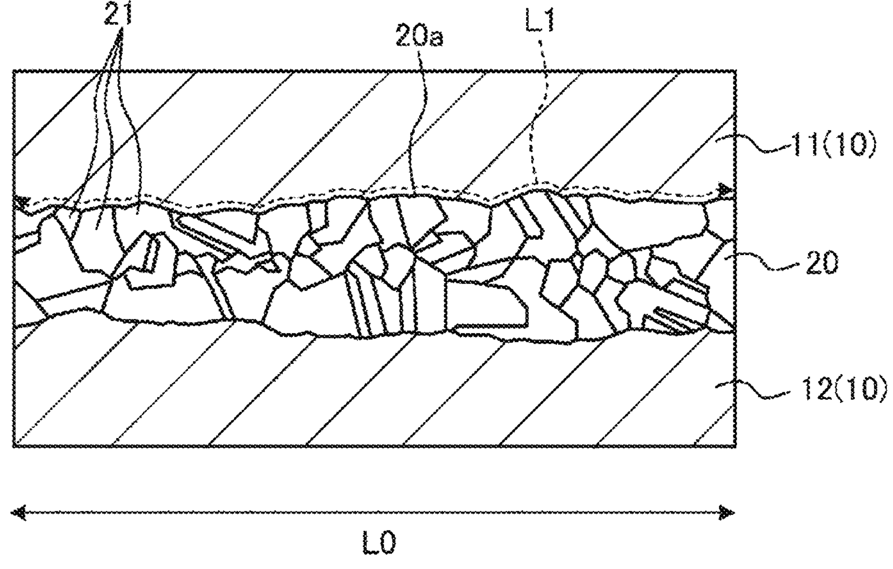
FIG. 2 is an enlarged view of a region A illustrated in FIG. 1.

FIG. 1 is an enlarged cross-sectional view illustrating an example of a wiring board 1 according to the embodiment, and FIG. 2 is an enlarged view of a region A illustrated in FIG. 1. As illustrated in FIG. 1 and FIG. 2, in the embodiment, the wiring board 1 includes an insulation layer 10 and an electrical conductor layer 20.

Examples of the insulation layer 10 include a glass ceramic sintered body. Note that the glass ceramic sintered body may contain a ceramic such as aluminum oxide, aluminum nitride, silicon carbide, silicon nitride, or mullite as a filler.

The insulation layer 10 may be made of, for example, a glass ceramic. Thus, a green sheet that is a raw material of the insulation layer 10 and an electrically conductive paste that is a raw material of the electrical conductor layer 20 are simultaneously fired to manufacture the wiring board 1. Thus, according to the embodiment, the manufacturing cost of the wiring board 1 can be reduced.

The insulation layer 10 may include a first layer 11 and a second layer 12 that face each other with the electrical conductor layer 20 interposed therebetween. The first layer 11 and the second layer 12 sandwich both surfaces of the electrical conductor layer 20 in a thickness direction.

The electrical conductor layer 20 has electrical conductivity and extends in a planar direction (lateral direction in FIG. 1) inside the insulation layer 10. For example, the electrical conductor layer 20 is disposed in a predetermined pattern shape between the first layer 11 and the second layer 12. Note that in the present disclosure, the electrical conductor layer 20 may be positioned on a surface of the wiring board 1 with the electrical conductor layer 20 exposed thereto.

As illustrated in FIG. 2, the electrical conductor layer 20 is constituted by a sintered body of a plurality of crystallites 21. The crystallites 21 are made of a metal material such as copper, silver, palladium, gold, platinum-tungsten, molybdenum, or manganese, or an alloy material or a mixed material containing these metal materials as main components.

Here, "containing a metal material or a metal (for example, copper) as a main component" refers to a case where a metal occupies 70% or more in terms of volume percentage in the electrical conductor layer 20. When the electrical conductor layer 20 includes voids, a volume percentage of the metal excluding the voids may be about 80% or more as a standard. An upper limit of the volume percentage of the metal (for example, copper) contained in the electrical conductor layer 20 may be 99%.

The upper limit of the volume percentage of the metal (for example, copper) contained in the electrical conductor layer 20 is set to 99% in consideration of the fact that an element contained in the insulation layer inevitably enters the electrical conductor layer 20 from the insulation layer 10 because the wiring board 1 of the present disclosure is formed by simultaneously firing the ceramic insulation layer and the metal.

The volume percentage of the metal in the electrical conductor layer 20 can be determined, for example, by the following method. In this case, an area percentage of the metal determined by the following method is used as the volume percentage. First, the wiring board 1 is cut or crushed to expose a cross section of the inside thereof.

Next, one electrical conductor layer 20 seen in the exposed cross section of the wiring board 1 is selected. At this time, when a length of the electrical conductor layer 20 is long enough to correspond to a width of the wiring board 1, a specific length is specified.

The specified length may be within a range in which a portion of the electrical conductor layer 20 to be evaluated is included in one photograph or screen when observing and photographing by using a scanning electron microscope (SEM), which will be described later. The size thereof is preferably larger than a thickness of the electrical conductor layer 20. The length may be preferably equal to or more than 1 μm and equal to or less than 100 μm as a standard.

Note that in the cross section of the wiring board 1, the target range of the electrical conductor layer 20 is preferably, for example, a range that can be seen as a contour when observed by using the scanning electron microscope. The contour of the electrical conductor layer 20 is preferably obtained from a backscattered electron image that is one of the analysis methods using the scanning electron microscope, but may be obtained by mapping analysis using an element analyzer attached to the scanning electron microscope.

An electron back scattered diffraction pattern (EBSD) method may be used for the measurement of a volume percentage of a metal. By using the electron back scattered diffraction pattern method, the volume percentage (area percentage) of the electrical conductor layer 20 can be obtained, and at the same time, the fact that the metal constituting the electrical conductor layer 20 is constituted by a plurality of crystallites can be observed.

When voids (including pores) are present in the electrical conductor layer 20, an area of all the voids included in the range to be observed may be excluded from an area of the electrical conductor layer 20 in advance. Note that as a size of a void to be counted as a void, a maximum diameter equal to or more than 0.1 μm is used as a standard.

Here, in the embodiment, when a specific range (for example, a region A) of the electrical conductor layer 20 in a cross-sectional view is designated, a linear length in a planar direction (lateral direction in FIG. 2) is defined as L0, and a length of a contour 20*a* of the electrical conductor layer 20 (that is, an interface length between the electrical conductor layer 20 and the insulation layer 10) is defined as L1, L1/L0 is within a range from 1.04 to 1.40.

Here, the specific range is a range in which a width of the electrical conductor layer 20 in a longitudinal direction is equal to or more than 10 μm and equal to or less than 100 μm. The width in the longitudinal direction in this specific range can be freely selected within a range of 10 μm (or more) and 100 μm or less. The freely selected width is determined in consideration of the thickness of the electrical conductor layer 20, the size of the crystallites 21 included in the electrical conductor layer 20, and the like.

For example, the specific range may be a range in which one electrical conductor layer 20 is sandwiched between an upper insulation layer 10 and a lower insulation layer 10. A plurality of positions may be designated as the specific range in a taken photograph. The specific area may be equal to or more than 100 $\mu m^2$ and equal to or less than 10000 $\mu m^2$.

As described above, in the embodiment, an interface electrical conductivity of the electrical conductor layer 20 can be increased by making the unevenness of the contour 20*a* of the electrical conductor layer 20 relatively small.

In addition, in the embodiment, the sintered body constituting the electrical conductor layer 20 may contain a silica particle 22 (see FIG. 3) having a nano size, and the silica particle 22 may be positioned on surfaces of the crystallites 21. In other words, in the wiring board 1, silica may be present in a particulate state at a surface of the electrical conductor layer 20.

Here, the "surface of the electrical conductor layer 20" refers to a portion near an interface between the insulation layer 10 and the electrical conductor layer 20 when the electrical conductor layer 20 is formed on a surface of the insulation layer 10. The portion "near the interface" includes a range having a small width from the surface of the electrical conductor layer 20 to the inside of the electrical conductor layer 20. The "small width" is a range within 1 μm from the surface of the electrical conductor layer 20.

When the silica particle 22 is present at the surface of the electrical conductor layer 20, the electrical conductor layer 20 is partially void-free within a distance of 1 μm from the silica particle 22 and within 1 μm from the surface of the electrical conductor layer 20. In this case, "void" refers to a space having a size equal to or larger than the maximum diameter of the silica particle 22.

The reason the electrical conductor layer 20 includes such a dense region around the silica particle 22 is considered to be that, as will be described later, the silica particle 22 is present at the interface with the insulation layer 10, reducing the diffusion of components from the insulation layer 10 into copper powder and controlling the sintering behavior of the copper powder, thereby resulting in gentle sintering.

Since the silica particle 22 is present in the vicinity of the interface with the insulation layer 10, the diffusion of glass components from the insulation layer 10 made of the glass ceramic is partially reduced. Thus, since the surface of the insulation layer 10 can be maintained in a gentle shape during firing, shapes of the surfaces of the electrical conductor layer 20 can be maintained flat. The silica particle 22 is less likely to excessively react with the insulation layer 10.

The electrical conductor layer 20 has a microstructure constituted by the crystallites 21 that are fine copper crystallites. In this case, the plurality of crystallites 21 include crystallites each of which has a polygonal shape including a linear side, and are in contact with each other at the sides as grain boundaries. The longest diameter of the crystallite 21 may be equal to or more than 1 μm and equal to or less than 10 μm. The plurality of crystallites 21 may include crystallites having two or more sides at a percentage equal to or more than 70% in terms of a percentage of the number of crystallites.

In the embodiment, the silica particle 22 is present at the surface of the electrical conductor layer 20, and thus, the adhesiveness between the electrical conductor layer 20 and the insulation layer 10 can be enhanced. Note that a plurality of silica particles 22 may be present across the entire surface of the electrical conductor layer 20 facing the insulation layer 10, or may be present only at a part of the surface of the electrical conductor layer 20. When a plurality of silica particles 22 are present at the surface of the electrical conductor layer 20, these silica particles 22 may be present in such a manner that the individual particles are isolated from each other.

The reason why the adhesiveness between the insulation layer 10 and the electrical conductor layer 20 is enhanced by the presence of the silica particles 22 at the surface of the electrical conductor layer 20 or near the interface between the insulation layer 10 and the electrical conductor layer 20 is considered to be due to the fact that the shrinkage behavior of a metal material (for example, copper) used in the electrical conductor layer 20 during firing is close to the shrinkage behavior of the silica particles 22.

In this case, the reason why the shrinkage behavior of the metal material used in the electrical conductor layer 20 during firing is close to the shrinkage behavior of the silica particles 22 is considered to be due to the fact that the size of the silica particles 22 is minute (nano size).

When the silica particles 22 having a size larger than the nano size are used, the particle size distribution is spread based on the size and a heat capacity is increased due to the size. Then, these factors cause changes in the sintering behavior and adhesiveness.

Note that when glass powder of a composite oxide is used instead of the silica particles 22 having the nano size, the glass powder contains a plurality of components, and thus a temperature range in which the glass powder becomes a molten state is wider than a temperature range in which the silica particles 22 having the nano size become a molten state.

For example, melting of the glass powder may start at a low temperature compared with that of the silica particles 22 having the nano size. The glass powder may often have a wide particle size distribution. When the glass powder having these properties is used, aggregation or transfer due to sintering is likely to occur in a print pattern where the glass powder becomes the electrical conductor layer 20 during firing.

As a result, when the electrical conductor layer 20 is formed, metal particles are likely to undergo grain growth and voids are likely to be generated in the electrical conductor layer 20. This is because the glass powder easily diffuses from a section of the print pattern to a region to be the insulation layer 10.

On the other hand, when the silica particles 22 having the nano size are used, a temperature range in which the silica particles 22 are in a molten state is narrower than a temperature range when the glass powder is used because the silica particles have a single composition. As a result, the electrical conductor layer 20 becomes dense, and a recessed portion having a gentle shape is easily formed in the surface along the insulation layer 10.

In the embodiment, a particle diameter of the silica particles 22 is preferably from 1 nm to 50 nm. Here, the particle diameter is a diameter. The diameter is the maximum diameter obtained when the silica particles 22 are observed. Among these, the silica particles 22 having an average particle diameter of 20 nm are preferred. The silica particles 22 preferably have a percentage of an integrated amount that is equal to or more than 70% when a lower limit is 10 nm and an upper limit is 30 nm.

In the embodiment, an area percentage of the silica particles 22 at the electrical conductor layer 20 may be from 2% to 0.067%. This can enhance the interface electrical conductivity of the electrical conductor layer 20. Note that a method for determining the area percentage of the silica particles 22 in the electrical conductor layer 20 will be described later.

In the embodiment, the content ratio of the silica particles 22 in the electrical conductor layer 20 may be from 0.099 wt % to 2.912 wt %. This can enhance the interface electrical conductivity of the electrical conductor layer 20. Here, the content ratio of the silica particles 22 is a ratio obtained by dividing an addition amount of the silica particles 22 by a total amount of the copper powder and the silica particles 22.

In the embodiment, the crystallites 21 may be made of copper as a main component, and the content ratio of copper in the electrical conductor layer 20 may be from 80 wt % to 99 wt %. This can further enhance the interface electrical conductivity of the electrical conductor layer 20.

In the embodiment, as illustrated in FIG. 2, the crystallites 21 may have polygonal shapes. Accordingly, a decrease in interface electrical conductivity in a high-frequency region (for example, from 1 GHz to 49 GHz) can be reduced, and thus the interface electrical conductivity of the electrical conductor layer 20 in the high-frequency region can be increased.

EXAMPLES

Examples of the present disclosure will be specifically described below. Note that in the examples, which will be described below, the wiring board including the insulation layer made of the glass ceramic and the electrical conductor layer containing copper as a main component will be described, but the present disclosure is not limited to the following examples.

Example 1

First, a mixture of 40 wt % of alumina particles and 60 wt % of borosilicate glass was prepared as a material of the insulation layer. The mixture is a glass ceramic raw material having a firing temperature of 900° C. to 1000° C.

As an organic binder, 20 parts by mass of isobutyl methacrylate resin and dibutyl phthalate were used per 100 parts by mass of the glass ceramic raw material, and a green sheet having a thickness of 100 μm was produced by doctor blade molding.

Copper powder having an average particle diameter of 2 μm (and having purity of 99.9 wt %) and silica particles having an average particle diameter of 20 nm were prepared as raw materials of the electrical conductor layer. The silica particles had a percentage of an integrated amount that is equal to or more than 70% when a lower limit is 10 nm and an upper limit is 30 nm. The addition amount of silica particles was 0.1 parts by mass relative to 100 parts by mass of the copper powder.

As an organic binder, isobutyl methacrylate resin and a mixed solvent of butyl carbitol acetate and dibutyl phthalate were used. A conductive paste containing copper powder and silica particles was prepared by adding 5 parts by mass of isobutyl methacrylate resin relative to 100 parts by mass of copper powder and further adding the mixed solvent of butyl carbitol acetate and dibutyl phthalate.

Next, the conductive paste was printed on both surfaces of the produced green sheet in a predetermined area and fired. Firing was performed in a reducing atmosphere using a hydrogen-nitrogen mixed gas at a maximum temperature of 930° C. for a holding time of 2 hours. A plurality of green sheets were layered to a thickness of 500 μm. This resulted in obtaining the wiring board 1 of Example 1.

Examples 2 to 7

The wiring boards 1 of Examples 2 to 7 were obtained by a method as in Example 1 described above and under conditions as in Example 1 except for the addition amount of the silica particles when preparing the conductive paste.

Note that in Examples 2 to 7, the addition amounts were 0.3 parts by mass, 0.5 parts by mass, 1 part by mass, 1.5 parts by mass, 2 parts by mass, and 3 parts by mass relative to 100 parts by mass of the copper powder when preparing the conductive paste, respectively.

Example 8

The wiring board 1 of Example 8 was obtained by a method as in Example 1 described above and under conditions as in Example 1 except for preparing the conductive paste. Note that in Example 8, copper powder (whose purity is 99.9 wt %) having an average particle diameter of 2 μm and borosilicate glass powder having an average particle diameter of 2 μm were prepared as raw materials for the electrical conductor layer. An addition amount of glass powder was 6 parts by mass relative to 100 parts by mass of copper powder.

As an organic binder, isobutyl methacrylate resin and a mixed solvent of butyl carbitol acetate and dibutyl phthalate were used. A conductive paste containing copper powder and glass powder was prepared by adding 5 parts by mass of isobutyl methacrylate resin relative to 100 parts by mass of copper powder and further adding a mixed solvent of butyl carbitol acetate and dibutyl phthalate.

Various Evaluations

Figure 3:
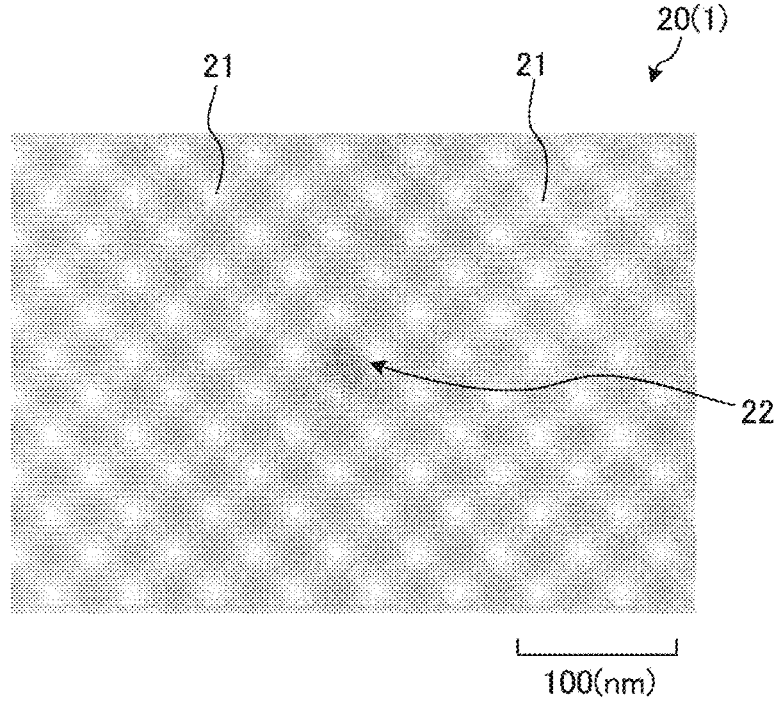
FIG. 3 is a diagram illustrating an SEM observation photograph of an electrical conductor layer according to Example 1.

Next, the wiring board 1 of each of Examples 1 to 8 obtained as described above was cut, the cut surface was mirror polished, and the cross section was observed with a scanning electron microscope. FIG. 3 is a diagram illustrating an SEM observation photograph of the electrical conductor layer 20 according to Example 1.

As illustrated in FIG. 3, in the embodiment, the silica particle 22 was observed between the crystallites 21 of copper adjacent to each other (that is, on the surfaces of the crystallites 21). A volume percentage of the metal (copper) contained in the electrical conductor layer 20 of the produced wiring board 1 was equal to or more than 90% and equal to or less than 98% in all samples except for portions of voids.

By using the SEM observation photographs obtained above, a ratio L1/L0 of the length L1 of the contour 20*a* of the electrical conductor layer 20 to the linear length L0 in the planar direction in each of Examples 1 to 8 was measured.

To be specific, first, a point A and a point B were put to both ends of one contour 20*a* of the electrical conductor layer 20 taken in the cross-sectional photograph, a straight line was drawn between the point A and the point B, and a length of the straight line was defined as L0. Next, a length of the contour 20*a* from the point A to the point B was obtained by using an image processing device, and the length was defined as L1. Finally, L1/L0 was determined as a ratio of both the lengths.

In addition, by using the SEM observation photographs obtained above, an area percentage of the silica particles 22 in each of Examples 1 to 8 was measured. Specifically, first, a plurality of square regions each of which had a length from 1/10 to 1/2 of the thickness of the electrical conductor layer 20 illustrated in the cross-sectional photograph were specified. For example, from eight to ten square regions were specified in such a manner as to be continuously aligned in the direction (planar direction) in which the electrical conductor layer 20 extends.

Next, an area of the metal portion (corresponding to the crystallites 21) in the region divided by the squares was defined as A0. An area of the black portion (corresponding to the silica particle 22) illustrated in FIG. 3 was defined as A1.

Then, a ratio A1/A0 of both areas was defined as the area percentage of the silica particle 22 in one square region. Finally, the average value of the area percentages of the silica particles 22 in the plurality of square regions was defined as the area percentage of the silica particles 22 of the sample.

Further, the interface electrical conductivity of each of the wiring boards 1 of Examples 1 to 8 obtained as described above was measured. The interface electrical conductivity was measured by a cylindrical dielectric resonator method, which will be described below. As a sample for measurement, a sample having a diameter of 50 mm and including the electrical conductor layer 20 formed substantially entirely on both surfaces thereof was used.

The method of measuring interface electrical conductivity by using the cylindrical dielectric resonator method is a method of measuring electrical conductivity at an interface between a conductor and an insulation layer, that is, at a conductor interface, by attaching the insulation layer including the conductor formed therein to both end surfaces or one end surface of a dielectric cylinder made of a dielectric material having a known relative permittivity and dielectric loss such that a predetermined relationship is established and thereby forming a dielectric resonator.

The principle of this measurement method is based on the fact that when conductor plates large enough to ignore an edge effect (usually, conductor plates having a diameter D of about three times a diameter d of the dielectric cylinder) are placed in parallel on both end surfaces of the dielectric cylinder having a predetermined dimensional ratio (height h/diameter d) and supported thereon to form an electromagnetic field resonator, a high-frequency current flowing through the conductor plates in a TEomn resonance mode (hereinafter, referred to as the TEomn mode) is distributed only on a short-circuited surface, that is, a facing surface between the dielectric body and the conductor.

In the dielectric resonator, by using the fact that the high-frequency current flowing through the conductor due to the TEomn mode (m=1, 2, 3, . . . , n=1, 2, 3, . . . ) is distributed only at an interface between the conductor and a dielectric board in contact with the dielectric cylinder, an interface electrical conductivity can be calculated from the measured resonant frequency f0 of the TEomn mode (m=1, 2, 3, . . . , n=1, 2, 3, . . . ) and no-load Q, Qu. The interface electrical conductivity was measured at a frequency of 10 GHz.

Presence or absence of conductor peeling in each of the wiring boards 1 of Examples 1 to 8 obtained as described above was evaluated. As a sample for evaluation, a sample in which the insulation layer 10 was layered on each of both surfaces of the electrical conductor layer 20 having one side from 10 mm to 50 mm was used.

In the evaluation of the conductor peeling, first, the sample for the evaluation was cut at a position of about 1/2 of the length in one direction, and each interface between the insulation layer 10 and the electrical conductor layer 20 in the cross section was observed. When at least one peeled portion was observed, "presence of peeling" was determined, and when no peeled portion was observed at all the interfaces, "absence of peeling" was determined.

Note that in the above determination, the state of "presence of peeling" was determined when a length of a region where the insulation layer 10 and the electrical conductor layer 20 were separated from each other by a distance equal to or more than 0.1 mm was equal to or more than 1 mm.

Table 1 shows addition amounts of silica particles and glass powder in the electrical conductor layer 20, a value of L1/L0 in the electrical conductor layer 20, an area percentage of the silica particles in the electrical conductor layer 20, a measurement result of the interface electrical conductivity at a frequency of 10 GHz, and an evaluation result of the presence or absence of conductor peeling for each of Examples 1 to 8. Note that the measurement result of the interface electrical conductivity at the frequency of 10 GHz is a relative value when an interface electrical conductivity with a direct current is set to 100%.

TABLE 1

| | Electrical conductor layer | | | | | |
|---|---|---|---|---|---|---|
| | Addition amount of silica particles (parts by mass) | Addition amount of glass parts by mass | L1/L0 | Area percentage of silica particles (%) | Interface electrical conductivity (10 GHz) (%) | Presence (Yes) or absence (No) of conductor peeling |
| Example 1 | 0.1 | 0 | 1.04 | 0.002 | 90 | Yes |
| Example 2 | 0.3 | 0 | 1.04 | 0.005 | 90 | No |
| Example 3 | 0.5 | 0 | 1.05 | 0.011 | 89 | No |
| Example 4 | 1 | 0 | 1.08 | 0.024 | 88 | No |
| Example 5 | 1.5 | 0 | 1.11 | 0.033 | 86 | No |
| Example 6 | 2 | 0 | 1.14 | 0.042 | 82 | No |
| Example 7 | 3 | 0 | 1.40 | 0.067 | 60 | No |
| Example 8 | 0 | 6 | 1.18 | 0 | 75 | No |

As shown in Table 1, the interface electrical conductivity of the electrical conductor layer 20 can be increased by setting the value of L1/L0 in the electrical conductor layer 20 within the range from 1.04 to 1.40. The interface electrical conductivity of the electrical conductor layer 20 can be further increased by setting the value of L1/L0 in the electrical conductor layer 20 within the range from 1.04 to 1.18.

The interface electrical conductivity of the electrical conductor layer 20 can be further increased by setting the value of L1/L0 in the electrical conductor layer 20 within the range from 1.04 to 1.14. The interface electrical conductivity of the electrical conductor layer 20 can be still further increased by setting the value of L1/L0 in the electrical conductor layer 20 within the range from 1.04 to 1.11.

Note that although not shown in Table 1, a wiring board (so-called printed circuit board) including an insulation layer made of a resin such as an epoxy resin and an electrical conductor layer made of a copper foil has a low adhesiveness between the resin (insulation layer) and the copper foil (electrical conductor layer). Therefore, the adhesiveness can be finally secured by enlarging unevenness of the contour of the electrical conductor layer to generate an anchor effect.

Therefore, in this printed circuit board, the value of L1/L0 in the electrical conductor layer becomes equal to or more than 2. This printed circuit board has the large unevenness of the contour of the electrical conductor layer, which reduces the interface electrical conductivity of the electrical conductor layer.

When the results in Table 1 are expressed in another way, according to the samples (Examples 1 to 7) produced by using the conductive paste in which the addition amount of the silica particles 22 is from 0.1 parts by mass to 3 parts by mass relative to 100 parts by mass of the copper powder, the interface electrical conductivity of the electrical conductor layer 20 can be increased. According to the samples (Examples 2 to 7) produced by using the conductive paste in which the addition amount of the silica particles 22 is from 0.3 parts by mass to 3 parts by mass, the conductor peeling of the electrical conductor layer 20 can be reduced.

Regarding the samples (Examples 2 to 6) produced by using the conductive paste in which the addition amount of the silica particles 22 is from 0.3 parts by mass to 2 parts by mass relative to 100 parts by mass of the copper powder, the interface electrical conductivity of the electrical conductor layer 20 can be further increased and the conductor peeling of the electrical conductor layer 20 can be reduced.

Regarding the samples (Examples 2 to 5) produced by using the conductive paste in which the addition amount of the silica particles 22 is from 0.3 parts by mass to 1.5 parts by mass relative to 100 parts by mass of the copper powder, the interface electrical conductivity of the electrical conductor layer 20 can be further increased, and the conductor peeling of the electrical conductor layer 20 can be reduced.

As shown in Table 1, the interface electrical conductivity of the electrical conductor layer 20 can be increased by setting the area percentage of the silica particles 22 in the electrical conductor layer 20 within a range from 0.002% to 0.067%. The conductor peeling of the electrical conductor layer 20 can be reduced by setting the area percentage of the silica particles 22 in the electrical conductor layer 20 within a range from 0.005% to 0.067%.

By setting the area percentage of the silica particles 22 in the electrical conductor layer 20 within a range from 0.005% to 0.042%, the interface electrical conductivity of the electrical conductor layer 20 can be further increased, and the conductor peeling of the electrical conductor layer 20 can be reduced.

By setting the area percentage of the silica particles 22 in the electrical conductor layer 20 within the range from 0.005% to 0.033%, the interface electrical conductivity of the electrical conductor layer 20 can be still further increased, and the conductor peeling of the electrical conductor layer 20 can be reduced.

Although the embodiments of the present disclosure have been described above, the present disclosure is not limited to the embodiments described above, and various changes can be made without departing from the spirit of the present disclosure. For example, although an example in which a fine powder of silica particles is added to an electrically conductive paste that is a raw material of the electrical conductor layer 20 has been illustrated in the embodiment described above, the present disclosure is not limited to the example.

For example, a ceramic fine powder other than silica (for example, alumina fine powder) may be added to the electrically conductive paste. In this case as well, the same and/or similar effects as those in the embodiment described above can be obtained.

Additional effects and other aspects can be easily derived by a person skilled in the art. Thus, a wide range of aspects of the present disclosure are not limited to the specific details and representative embodiments represented and described above. Accordingly, various changes are possible without departing from the spirit or scope of the general inventive concepts defined by the appended claims and their equivalents.

REFERENCE SIGNS

1 Wiring board
10 Insulation layer
20 Electrical conductor layer
**20*a*** Contour
21 Crystallite
22 Silica particle

The invention claimed is:

1. A wiring board comprising:
an insulation layer made of a ceramic; and
an electrical conductor layer extending in a planar direction inside the insulation layer,
the electrical conductor layer being constituted by a sintered body of a plurality of crystallites comprising a metal as a main component, and
L1/L0 being within a range from 1.04 to 1.40 when a specific range of the electrical conductor layer is specified in a cross-sectional view, a linear length in the planar direction is defined as L0, and a length of a contour of the electrical conductor layer is defined as L1,
wherein
the sintered body comprises silica particles having a diameter from 1 nm to 50 nm, and
the silica particles are located on surfaces of the plurality of crystallites, and
wherein
an area percentage of the silica particles in the electrical conductor layer is from 0.002% to 0.067%.

2. The wiring board according to claim 1, wherein
a content ratio of the silica particles in the electrical conductor layer is from 0.099 wt % to 2.912 wt %.

3. The wiring board according to claim 1, wherein
the plurality of crystallites comprise copper as a main component, and
a content ratio of the copper in the electrical conductor layer is from 80 wt % to 99 wt %.

4. The wiring board according to claim 1, wherein
the plurality of crystallites have polygonal shapes.

* * * * *